United States Patent
Gates et al.

(10) Patent No.: US 9,472,710 B1
(45) Date of Patent: Oct. 18, 2016

(54) LOW-LOSS LARGE-GRAIN OPTICAL WAVEGUIDE FOR INTERCONNECTING COMPONENTS INTEGRATED ON A GLASS SUBSTRATE

(71) Applicant: International Business Machines Corporation, Armonk, NY (US)

(72) Inventors: Stephen M. Gates, Ossining, NY (US); Joyeeta Nag, Wappingers Falls, NY (US); Jason S. Orcutt, Katonah, NY (US); Jean-Olivier Plouchart, New York, NY (US); Spyridon Skordas, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/959,186

(22) Filed: Dec. 4, 2015

Related U.S. Application Data

(63) Continuation of application No. 14/874,615, filed on Oct. 5, 2015.

(51) Int. Cl.
*G02B 6/12* (2006.01)
*H01L 31/18* (2006.01)

(52) U.S. Cl.
CPC ......... *H01L 31/182* (2013.01); *H01L 31/1864* (2013.01); *H01L 31/1868* (2013.01); *H01L 31/1872* (2013.01)

(58) Field of Classification Search
CPC ............... H01L 2924/00; H01L 2924/00014; H01L 2224/48091; G02B 6/43; G02B 6/4214; G02B 6/12

USPC .......................... 385/14, 15, 31, 39
See application file for complete search history.

(56) References Cited

U.S. PATENT DOCUMENTS

| | | | |
|---|---|---|---|
| 6,925,216 B2 | 8/2005 | Vernon et al. | |
| 7,271,445 B2 | 9/2007 | Forbes et al. | |
| 7,627,018 B1 * | 12/2009 | Guilfoyle | G02B 6/4214 372/102 |
| 7,773,840 B2 | 8/2010 | Kwakernaak et al. | |
| 7,831,123 B2 | 11/2010 | Sparacin et al. | |
| 8,160,404 B2 * | 4/2012 | Pan | G02F 1/025 385/129 |
| 8,265,432 B2 | 9/2012 | Doany et al. | |
| 8,805,130 B2 | 8/2014 | Lipson et al. | |

(Continued)

OTHER PUBLICATIONS

Kwong at al., "Low Loss Polycrystalline Silicon Waveguides and Devices for Multilayer On-Chip Optical Interconnects." Optoelectronic Interconnects XIII, 863012,Feb. 27, 2013; (8 pages).

(Continued)

*Primary Examiner* — Jennifer Doan
(74) *Attorney, Agent, or Firm* — Cantor Colburn LLP; Vazken Alexanian

(57) ABSTRACT

Embodiments are directed to a coupler system having an interposer configured to couple optical signals. The interposer includes at least one optoelectronic component formed on a glass substrate. The interposer further includes at least one waveguide formed on the glass substrate and configured to couple the optical signals to or from the at least one optoelectronic component, wherein the at least one waveguide comprises a waveguide material having grain diameters greater than about one micron and an optical loss less than about one decibel per centimeter of optical propagation.

7 Claims, 9 Drawing Sheets

(56) References Cited

U.S. PATENT DOCUMENTS

2007/0104441 A1  5/2007  Ahn et al.
2008/0180340 A1  7/2008  Hobbs et al.

OTHER PUBLICATIONS

List of IBM Patents or Patent Applications Treated as Related—Date Filed: Mar. 22, 2016; 2 page.
Orcutt et al., "Low-loss polysilicon waveguides fabricated in an emulated high-voume electronics process." Mar. 26, 2012 / vol. 20, No. 7 / Optics Express 7243-7254.
Orcutt et al., "Nanophotonic integration in state-of-the-art CMOS foundries." Jan. 31, 2011 / vol. 19, No. 3 / Optics Express 2335-2346.
Schröder et al., "glassPack—A 3D Glass Based Interposer Concept for SiP with Integrated Optical Interconnects." (7 pages).
Schröder et al., "Strategies for glass based photonic system integration." 2014 Electronics System-Integration Conference (7 pages).
Stephen M. Gates et al., "Low-Loss Large-Grain Optical Waveguide for Interconnecting Components Integrated on a Glass Substrate." U.S. Appl. No. 14/874,615, filed Oct. 5, 2015.
Töpper et al., "3-D Thin Film Interposer Based on TGV (Through Glass Vias): An Alternative to Si-Interposer." 2010 Electronic Components and Technology Conference. (8 pages).
Zhang et al., "Single-Grain Si TFTs using Spin-Coated Liquid-Silicon." Electron Devices Meeting (IEDM), 2011 IEEE International (4 PGS).
Lee, et al., "Back-End Deposited Silicon Photonics for Monolithic Integration on CMOS", IEEE Journal of Selected Topics in Quantum Electronics, vol. 19, No. 2, Mar./Apr. 2013, IEEE, 7 pages.

\* cited by examiner

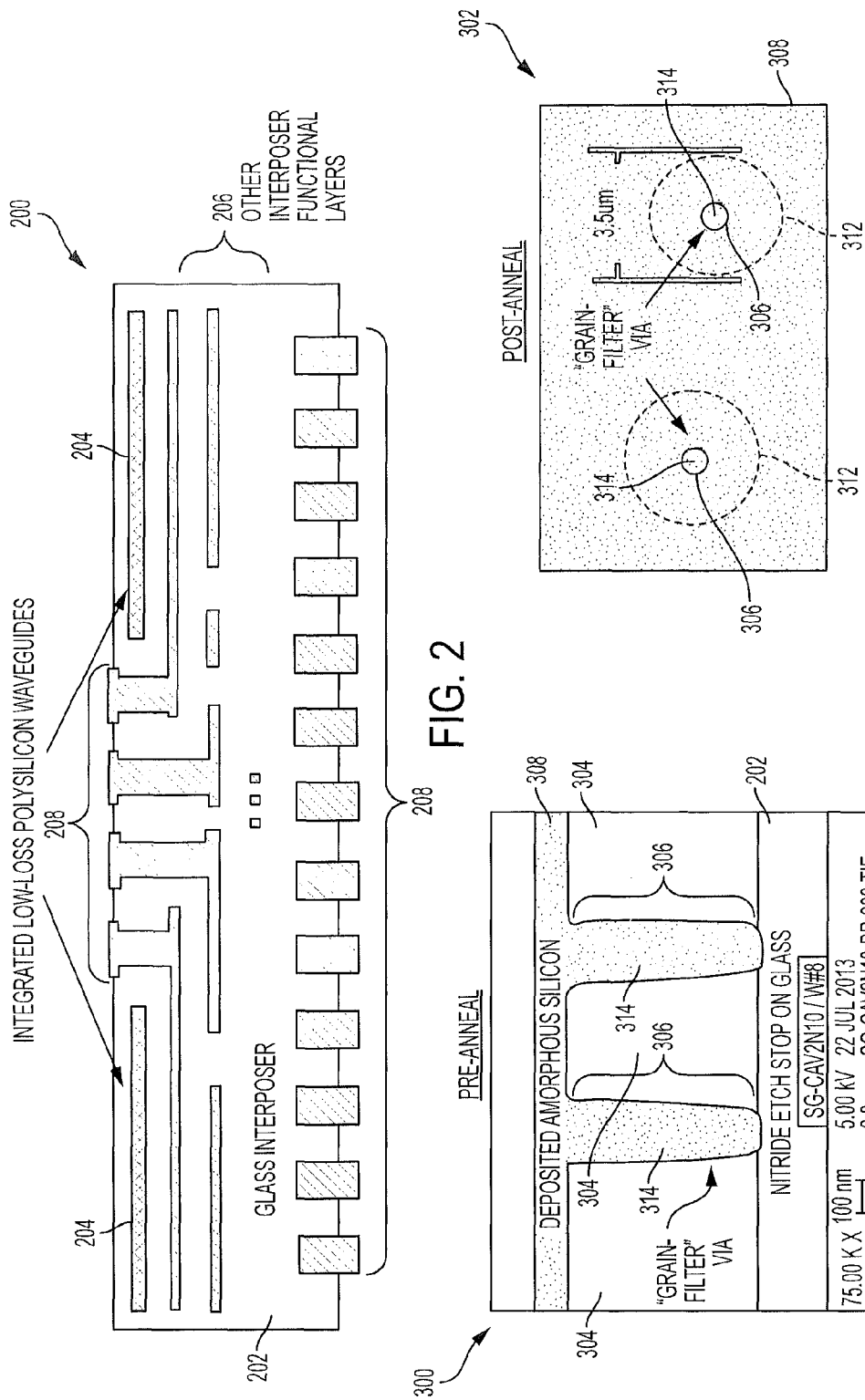

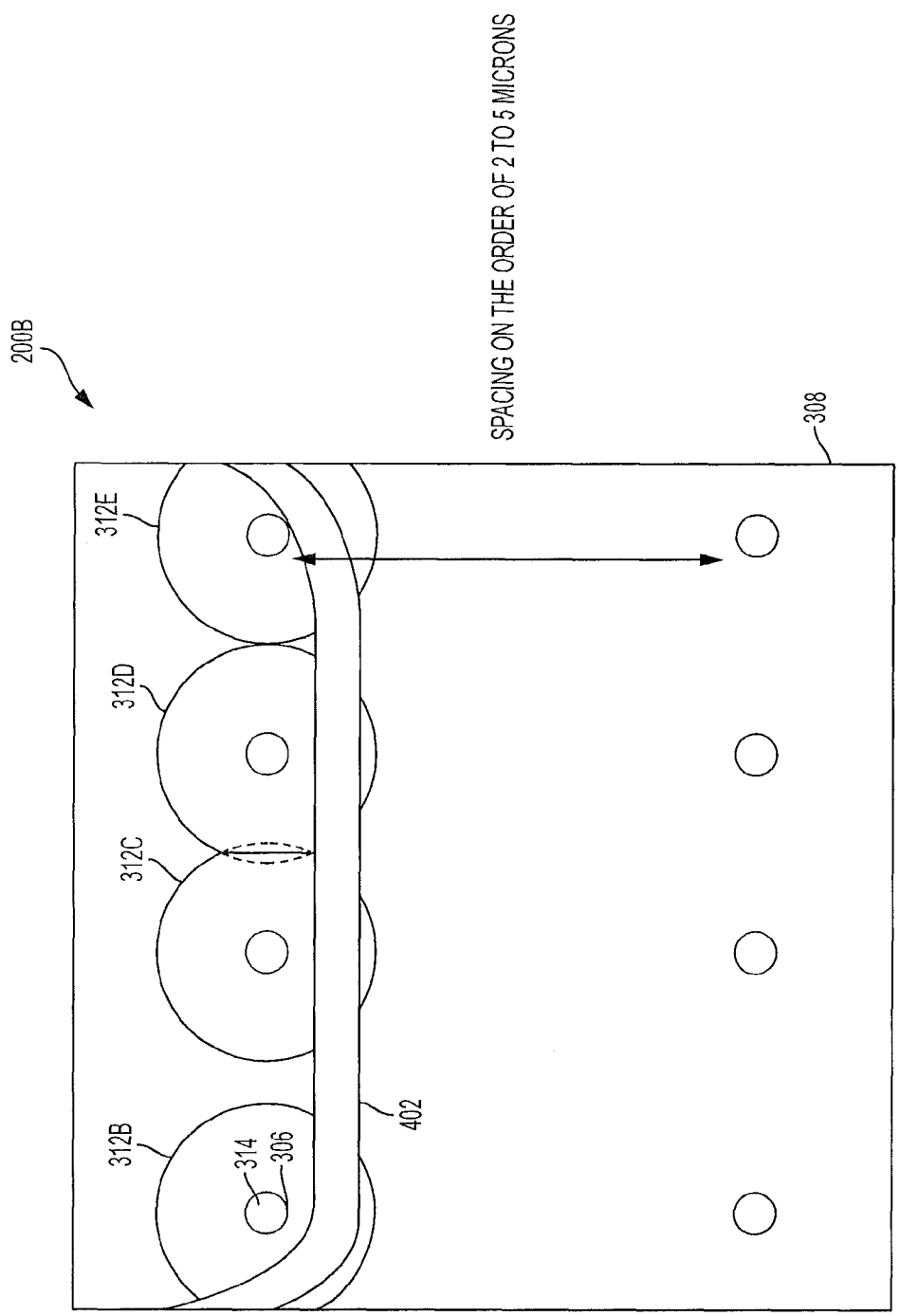

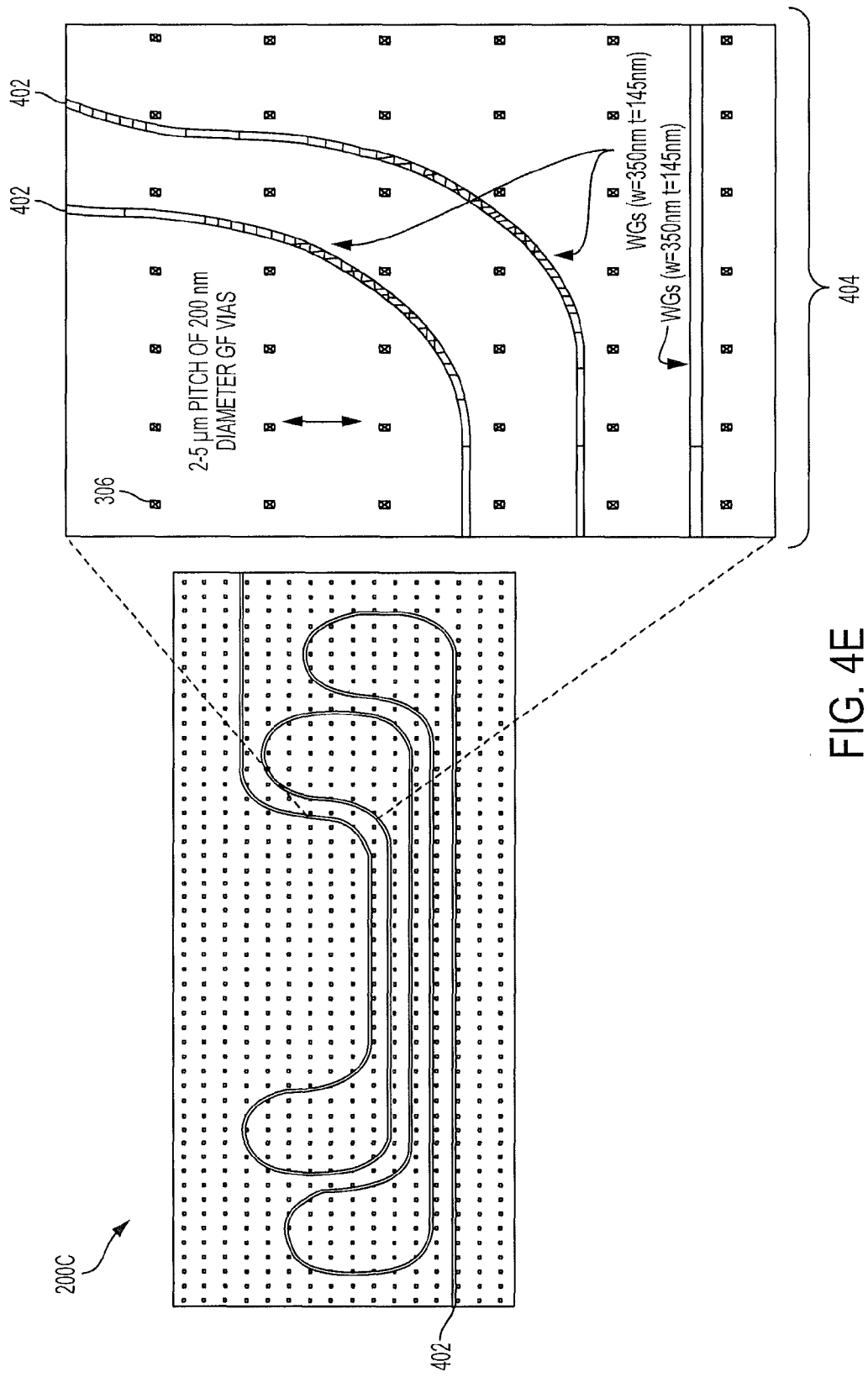

US 9,472,710 B1

LOW-LOSS LARGE-GRAIN OPTICAL WAVEGUIDE FOR INTERCONNECTING COMPONENTS INTEGRATED ON A GLASS SUBSTRATE

DOMESTIC PRIORITY

The present application claims priority to U.S. Nonprovisional application Ser. No. 14/874,615 filed on Oct. 5, 2015 titled "LOW-LOSS LARGE-GRAIN OPTICAL WAVEGUIDE FOR INTERCONNECTING COMPONENTS INTERGRATED ON A GLASS SUBSTRATE," assigned to the assignee hereof and expressly incorporated by reference herein.

BACKGROUND

The present disclosure relates in general to the interconnection of components and integrated circuits (ICs). More specifically, the present disclosure relates to providing component and IC interconnections using an interposer having low-loss large-grain single-mode optical waveguides, photonic components, optoelectronic components and electronic components integrated on a mechanically stable substrate suitable for high volume manufacturing.

Interconnect bottlenecks are mitigated, and in many cases overcome, by replacing selected electrical signals and metallic connections with optical signals and optical couplers. The optical signals, once coupled to the IC, are routed to target downstream photonic and optoelectronic components. Optical loss, which can be measured in decibels (dB) per centimeter (cm) of optical propagation, is a limiting factor in the effective and efficient implementation of optical couplers and downstream optical routing systems. As used in the present disclosure, a large optical loss is an optical loss that is greater than about 20-25 dB/cm.

SUMMARY

Embodiments are directed to a coupler system fabricated on an interposer configured to couple optical signals. The interposer includes at least one optoelectronic component formed on a glass substrate. The interposer further includes at least one waveguide formed on the glass substrate and configured to couple the optical signals to or from the at least one optoelectronic component, wherein the at least one waveguide includes a waveguide material having grain diameters greater than about one micron.

Embodiments are directed to a coupler system having an interposer configured to couple optical signals. The interposer includes at least one optoelectronic component formed on a glass substrate. The interposer further includes at least one waveguide formed on the glass substrate and configured to couple the optical signals to or from the at least one optoelectronic component, wherein the at least one waveguide includes a waveguide material having a plurality of single-grain regions and an optical loss less than about one decibel per centimeter of optical propagation.

Embodiments are further directed to a method of forming a coupler system. The method includes forming a glass substrate, forming a dielectric layer over the glass substrate and forming a plurality of wells in the dielectric layer. The method further includes depositing a semiconductor material over the dielectric layer such that the semiconductor material fills the plurality of wells and forms a layer of semiconductor material. The method further includes annealing the semiconductor material such that the semiconductor material inside the plurality of wells act as a nucleation seed producing a post-anneal grain size within a plurality of post-anneal regions in the semiconductor material around the plurality of wells, wherein the post-anneal grain size is greater than about 0.5 micron. The method further includes forming at least one waveguide from the post-anneal regions and forming at least one optoelectronic component over the dielectric layer, wherein the at least one waveguide is configured to couple the optical signals to or from the at least one optoelectronic component.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

FIG. 2 is a cross-sectional view showing a schematic diagram of a glass interposer in accordance with one or more embodiments;

FIG. 3A is a diagram of an electron microscope image in cross-section showing the formation of grain filter wells in accordance with one or more embodiments;

FIG. 3B is another electron microscope image showing the formation of grain filter wells in accordance with one or more embodiments;

FIG. 4D is another diagram further illustrating the formation of an optical waveguide in accordance with one or more embodiments;

FIG. 4E is another diagram further illustrating the formation of an optical waveguide in accordance with one or more embodiments;

Figure 1:
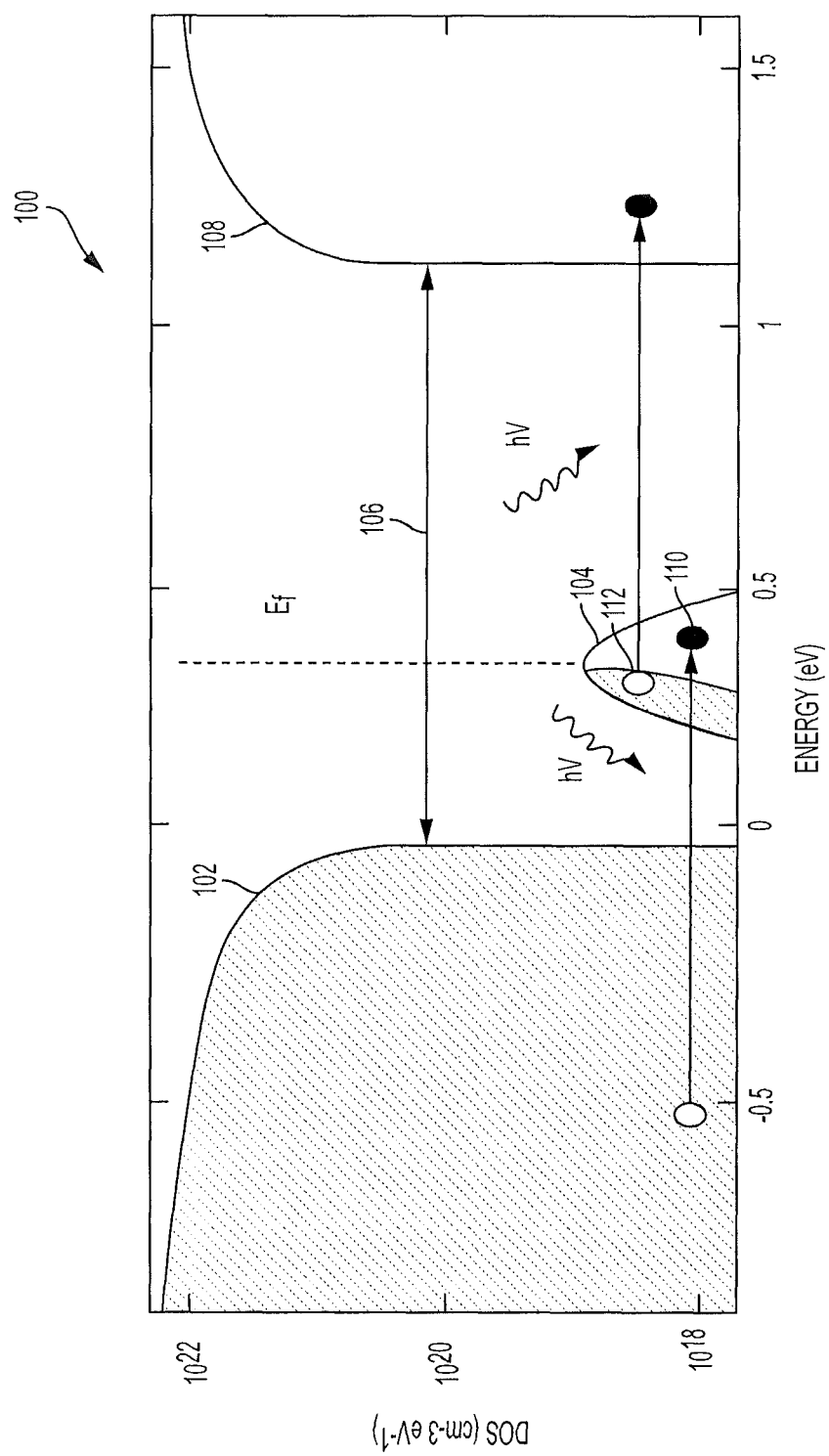
FIG. 1 is a plot illustrating a relationship between optical propagation loss and grain boundaries that is identified and leveraged in accordance with one or more embodiments.

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this disclosure includes a detailed description of an interposer design implemented as a low-loss, large-grain single-mode polycrystalline optical waveguide integrated on a glass substrate, implementation of the teachings recited herein are not limited to a particular interposer configuration or operating environment. Rather embodiments of the present disclosure are capable of being implemented in conjunction with any other type of interposer configuration or operating environment now known or later developed. Additionally, although embodiments of the present disclosure focus on silicon as the base waveguide material, the teachings of the present disclosure may be implemented in connection with other base waveguide materials such as germanium or alloys of silicon and germanium.

Various embodiments of the present disclosure will now be described with reference to the related drawings. Alternative embodiments may be devised without departing from the scope of this disclosure. It is noted that various connections and positional relationships (e.g., over, below, adjacent, etc.) are set forth between elements in the following description and in the drawings. These connections and/or positional relationships, unless specified otherwise, may be direct or indirect, and the present disclosure is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Interconnect bottlenecks are mitigated, and in many cases overcome, by replacing selected electrical signals and metallic connections with optical signals and optical couplers. The optical signals, once coupled to the IC, are routed to target downstream photonic and optoelectronic components. Large optical loss is a limiting factor in the effective and efficient implementation of optical couplers and downstream optical routing systems. As used in the present disclosure, a large optical loss is an optical loss that is greater than about 20-25 dB per cm of optical propagation.

Turning now to an overview of the present disclosure, one or more embodiments provide designs and fabrication methodologies for optical coupler systems that interconnect ICs and components thereof. More specifically, one or more embodiments of the present disclosure provide a low-loss optical coupler system fabricated on an interposer that incorporates low-loss, large-grain single-mode polycrystalline optical waveguides, photonic devices (e.g., wave division multiplexers/demultiplexers), optoelectronic devices (e.g., photodiodes, lasers, etc.) and electronic devices (e.g., transistors, capacitors, inductors, etc.) integrated with, directly coupled to or directly bonded to a mechanically stable substrate (e.g., glass) suitable for high volume manufacturing. The disclosed interposer functions as a photonic interface that spreads connection to a wider pitch and routes or reroutes photonic and electronic signals between one socket/connection and another socket/connection. The photonic devices of the present disclosure include any device that sources, detects and controls various forms of radiation such as gamma rays, X-rays, ultraviolet light, infrared light and visible light. Additionally, the optoelectronic devices of the present disclosure include any device that converts optical signals to electronic signals or vice versa.

In general, optical waveguides are dielectric structures that transmit various forms of radiation or electromagnetic waves in a direction that is parallel (i.e., transverse) to the waveguide's propagation axis. Optical waveguides are fundamental building blocks of many optical systems, including fiber-optic communications links, fiber lasers and amplifiers for high-power applications, as well as all-optical photonic ICs. Optical waveguides can be classified according to their geometry (e.g., planar, slab/strip, fiber waveguides, etc.), mode structure (e.g., single-mode, multi-mode, etc.), refractive index distribution (e.g., step, gradient, etc.), guiding mechanism (e.g., total internal reflection, anti-guiding, photonic band-gap, etc.) and waveguide material (e.g., glass, polymer, semiconductor, etc.).

As noted immediately above, the mode structure of an optical waveguide may be multi-mode or single-mode. Because multi-mode optical waveguides support the transmission of multiple distinct signals, their transverse dimension can be large, which makes them well suited for short distance optical applications. Thus, multi-mode optical waveguides are an initially attractive option for implementing the short distance optical coupling that often occurs in an interposer. However, it is difficult to perform higher level optical signal processing (e.g., wavelength division multiplexing) using multi-mode optical signals. Further, their large transverse dimension makes it difficult to interface multi-mode optical waveguides to the single-mode optical fibers that are typically used to communicate over longer distances. In contrast, single-mode optical waveguides interface effectively with single-mode, long distance optical fibers. Additionally, single-mode optical waveguides are compatible with the performance of higher level optical signal processing. However, when scaled to single-mode dimensions, optical waveguides typically have large optical losses (e.g., loss≥about 20 dB/cm). As previously noted herein, large optical loss is a limiting factor in the effective and efficient implementation of optical coupler systems. More specifically, large optical loss is a limiting factor in the effective and efficient implementation of single-mode optical waveguides in optical coupler systems.

Accordingly, in one or more embodiments the optical waveguides of the disclosed optical coupler system are low-loss, large-grain single-mode polycrystalline optical waveguides that are compatible with long distance single-mode optical communication fibers and enable high data rate optical communications using higher level optical signal processing such as wavelength division multiplexing/demultiplexing. The large-grain structure and low-loss optical waveguide characteristic provided by one or more embodiments are associated in that the present disclosure identifies and leverages an inverse relationship between the grain size of the waveguide semiconductor material and the optical loss of the waveguide semiconductor material. Specifically, increasing the grain size of the waveguide semiconductor material decreases the optical loss of the waveguide semiconductor material.

Forming low-loss large-grain polycrystalline waveguides according to one or more embodiments result in a grain size (e.g., diameter or width) that is greater than about one micron, as well as an optical loss that is less than about one dB/cm. As used in the present disclosure, a reference to a large-grain grain size is a reference to a material having a grain size (e.g., diameter) greater than about one micron. As also used in the present disclosure, a reference to a low-loss characteristic is a reference to material having an optical loss characteristic that is less than about one dB/cm. Thus, the large-grain grain size and the associated low-loss optical characteristic provided by the present disclosure, along with the process details described herein, enable the effective and efficient implementation of optical coupler systems in general. More specifically, the large-grain grain size and low-loss optical characteristic provided by the present disclosure enable the effective and efficient implementation of low-loss, single-mode optical waveguides as part of an interposer design incorporated in an optical coupler system.

A description of how grain size impacts optical loss according one or more embodiments is provided with reference to FIG. 1. Detailed descriptions of low-loss large-grain polycrystalline waveguides that leverage the impact of grain size on optical loss according to one or more embodiments are provided later in this disclosure in connection with the descriptions of FIGS. 2-5. FIG. 1 is a plot 100 illustrating a relationship between optical propagation loss and grain boundaries that is identified and leveraged in accordance with one or more embodiments of the present disclosure. More specifically, plot 100 shows an example of the density of states (DOS) vs. the electron energy (eV) for polycrystalline silicon. Plot 100 includes a valence band 102, a grain boundary band 104 formed from localized defect states (e.g., 110, 112) of the polycrystalline silicon, a band gap 106 and a conduction band 108. $E_f$ is the Fermi energy, which roughly denotes the transition between occupied and unoccupied defect states (e.g., 110, 112) in grain boundary band 104. The shading underneath valence band 102, grain boundary band 104 and conduction band 108 indicates a density of the occupied electron states of the band. Plot 100 illustrates how light or other electromagnetic radiation in the form of photon energy (hv) can be absorbed by polycrystalline silicon material, thereby resulting in a loss of some portion of any optical energy that is transported by the polycrystalline silicon material. Although plot 100 is developed for silicon, a similar plot may be developed for other semiconductor materials.

In solid-state physics, a band gap is typically an energy range in a solid where no electron states can exist. As shown in FIG. 1 (moving from left to right), band gap 106 is the energy difference between the top of valence band 102 and the bottom of conduction band 108. If the valence band is completely full and the conduction band is completely empty, electrons cannot move in the solid. However, if some electrons transfer from the valence band to the conduction band, current can flow. Therefore, the size of the band gap is a major factor in determining the electrical conductivity of a solid. Substances with large band gaps are generally insulators, and substances with smaller band gaps are semiconductors. Substances that are conductors have either very small band gaps or none.

Materials may be characterized as crystalline, polycrystalline or amorphous. A crystal or crystalline solid is a solid material having constituent atoms, molecules or ions arranged in an ordered pattern extending in all three spatial dimensions. When the periodicity in the crystal structure is interrupted at so-called grain boundaries, the crystal is said to be polycrystalline. A polycrystalline solid is a solid material having constituent atoms, molecules or ions are arranged in many ordered patterns fused together into a single solid. An amorphous or non-crystalline solid is a solid material having constituent atoms, molecules or ions having no periodic structure whatsoever.

In contemporary crystalline materials, optical absorption occurs when photons have sufficient energy (e.g., hv≥band gap 106) to raise or excite electrons in valence band 102 across band gap 106 into conduction band 108. For typical light transmissions (e.g., infrared), photon energy alone is insufficient to raise electrons in valence band 102 across band gap 106 into conduction band 108. However, when the silicon is polycrystalline, there are grain boundaries and associated localized states, which are represented by grain boundary band 104 formed from localized defect states (e.g., 110, 112) of the polycrystalline. These grain boundaries and their localized defect states have sufficient energy associated with them to, along with the photon energy of light traveling through the grain boundaries, raise or excite electrons in valence band 102 to an unoccupied defect state (e.g., 110) within grain boundary band 104, and also raise or excite electrons from an occupied defect state (e.g., 112) within grain boundary band 104 into conduction band 108. Accordingly, these localized defect states and the photon energy (hv) from optical signals (e.g., infrared) traveling through the polycrystalline silicon can generate sufficient energy to move electrons from valence band 102 through unoccupied defect states (e.g., 110 or 112) of grain boundary band 104 to unoccupied defect states of conduction band 108, thereby causing a loss of some portion of the optical signals.

One or more embodiments of the present disclosure identify and leverage the observation that the amount of optical loss caused by grain boundary band 104 of the polycrystalline material is proportional to the density of the defect states (e.g., 110, 112) that make up grain boundary band 104. The density of the defect states that make up grain boundary band 104 may be determined by the total number of grain boundaries averaged over the relevant area(s) of the material. According to the present disclosure, optical absorption, and hence optical loss, of optical signals that are transported through a polycrystalline material can be minimized and/or reduced by providing large-grains (e.g., a grain diameter or width ≥about 1 micron) in the polycrystalline material. In one or more embodiments, formation of the large grains includes defect reduction using a hydrogen-based anneal, along with smoothing the polycrystalline material. The large-grains achieved in accordance with the present disclosure reduce the total number of grain boundaries averaged over the relevant area(s) of the polycrystalline material, thereby reducing the density of the defect states that make up grain boundary band 104 and reducing the absorption/loss of optical signals that are transported through the polycrystalline. In other words, increasing the grain size of a material according to the present disclosure reduces the effective density of the grain boundaries volume per unit volume in the material.

As will be described in greater detail herein below, one or more embodiments of the present disclosure form low-loss, large-grain polycrystalline semiconductor waveguides according to a fabrication methodology that includes forming an oxide layer on a glass substrate, forming a plurality of vias or wells in selected locations of the oxide layer, filling the plurality of wells with amorphous semiconductor material to form a plurality of seed areas within the wells and a layer of amorphous semiconductor material above the wells, annealing the amorphous semiconductor material such that the seed areas within the wells form a plurality of large-grain crystallized areas in the semiconductor material surrounding the wells, then forming the optical waveguides from the plurality of large-grain crystallized areas that surround the plurality of wells.

The low-loss optical characteristics achieved according to the present disclosure enable the effective and efficient interconnection of ICs and components using an interposer having the disclosed low-loss large-grain single-mode polycrystalline silicon waveguide, photonic devices, optoelectronic devices and electronic devices integrated on, directly coupled to and/or bonded directly on a glass substrate suitable for high volume manufacturing. The glass substrate is dimensionally stable during thermal processing, which may range up to about 600 degrees Celsius. The disclosed fabrication methodologies enable a highly integrated design that avoids the increased fabrication costs and complexity that results from using separate methods of assembly for the different components of the optical coupler system/platform.

The refractive index of the disclosed low-loss large-grain polycrystalline silicon waveguide is high in comparison to the glass substrate of the interposer, which results in a high index contrast and enables the integration of a wide variety of small photonic components. The use of small optical components allows them to be moved closer, which improves overall electrical performance. Accordingly, the optical coupling components that can be formed on the disclosed optical coupler system/platform include vertical gratings that in effect couple light in and out of plane, as well as adiabatic coupler interfaces that enable the transition from the low-loss optical waveguide of the glass substrate to either an optical fiber or a IC coupled directly to or bonded directly on the glass substrate.

The glass substrate provides a low radio frequency (RF) loss environment, which improves the electrical performance of the low-loss optical waveguide interfaces. High density wiring may be utilized with the low RF loss environment and highly integrated fabrication to allow small components such as inductors and/or capacitors to be implemented as "direct drive" optical components, wherein the active device (e.g., detectors, laser, modulators, etc.) is integrated on the glass substrate and connected through the high density metal wiring on the glass substrate to any connected ICs that provide the data I/O (input/output). This "direct drive" configuration is in contrast to standard optical interface designs that require a source or destination of data to route through an intermediate electrical communication channel to a remote driver or receiver IC that would interface to the optical component. In the present disclosure, a reference to "direct drive" means that the source IC and/or the destination IC are directly wired to the source and/or the receiving optical/electronic component.

The disclosed glass substrate has a coefficient of thermal expansion (CTE) that can be matched to silicon to form the silicon-on-glass platform. In one or more embodiments, the glass substrate can, in addition to integrating the low-loss large-grain optical waveguides and electrical interconnections, also integrate thin film silicon driver circuits (e.g., transistors) that can be optimized for different voltages such as the higher voltages than are typically found in integrated CMOS (complementary metal-oxide semiconductor) technology.

Figure 6:
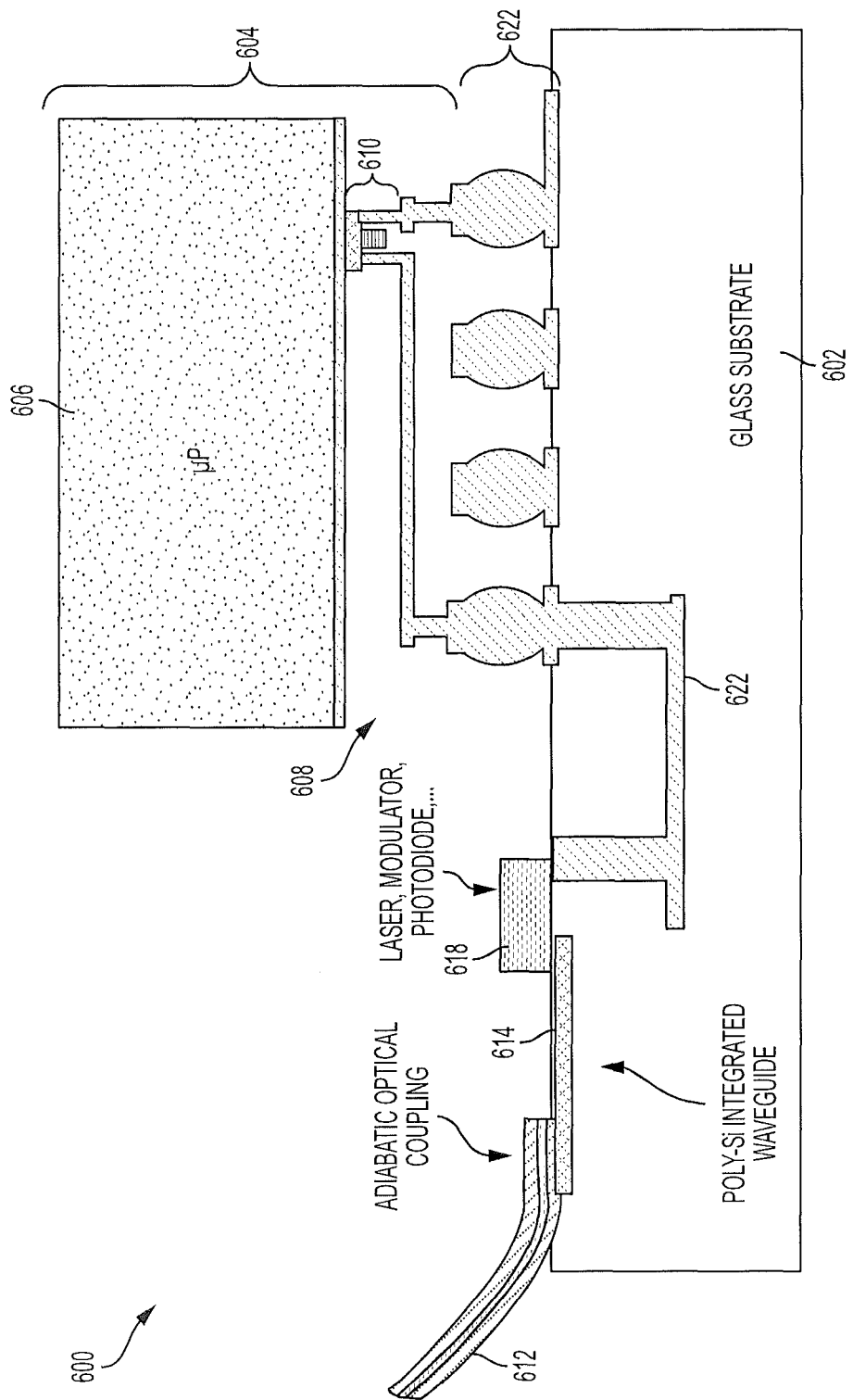
FIG. 6 is a cross-sectional view showing a schematic diagram of a system for providing photonic and electronic connectivity in accordance with one or more embodiments.
Figure 7:
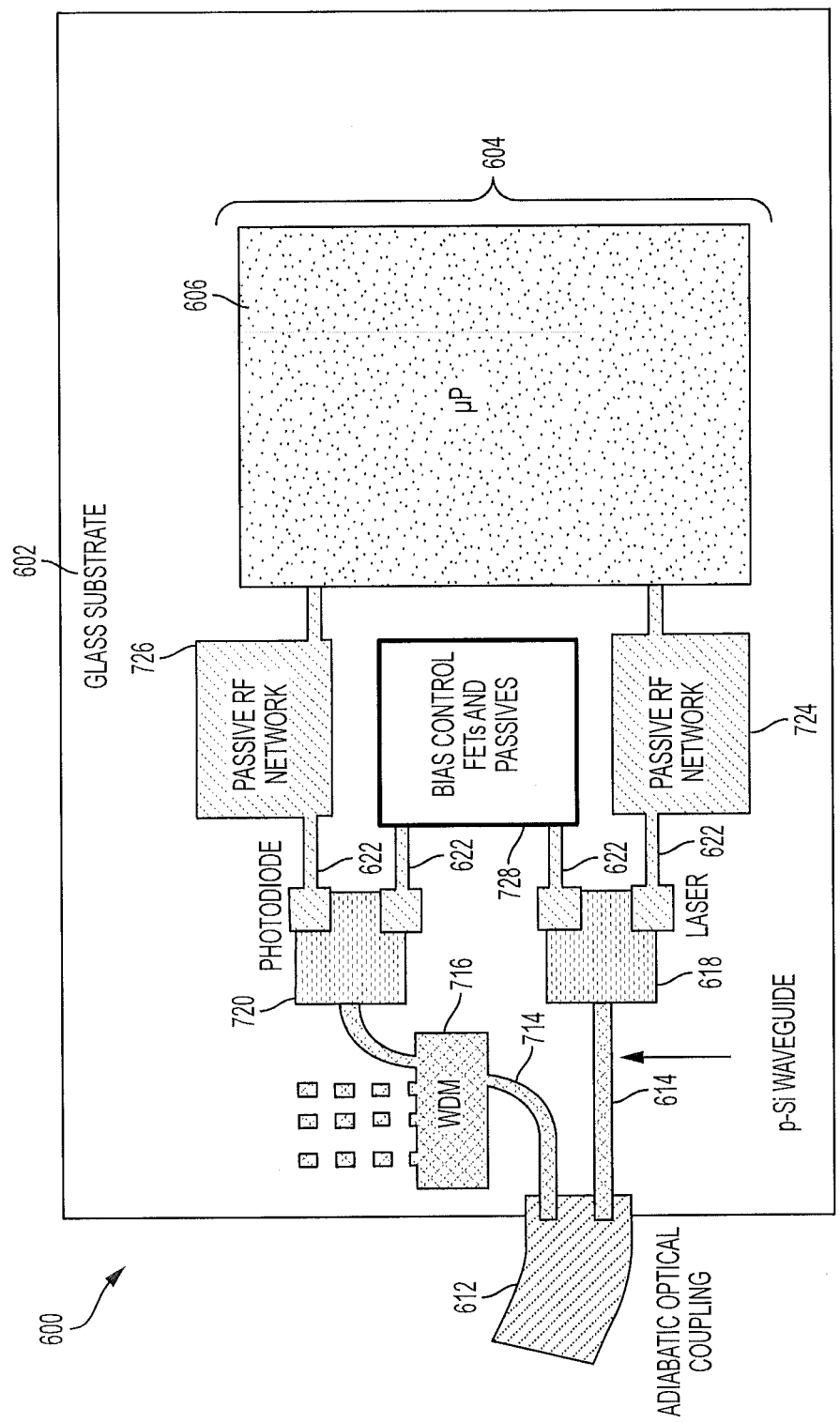
FIG. 7 is a top-down view of the schematic diagram shown in FIG. 6.
Figure 8:
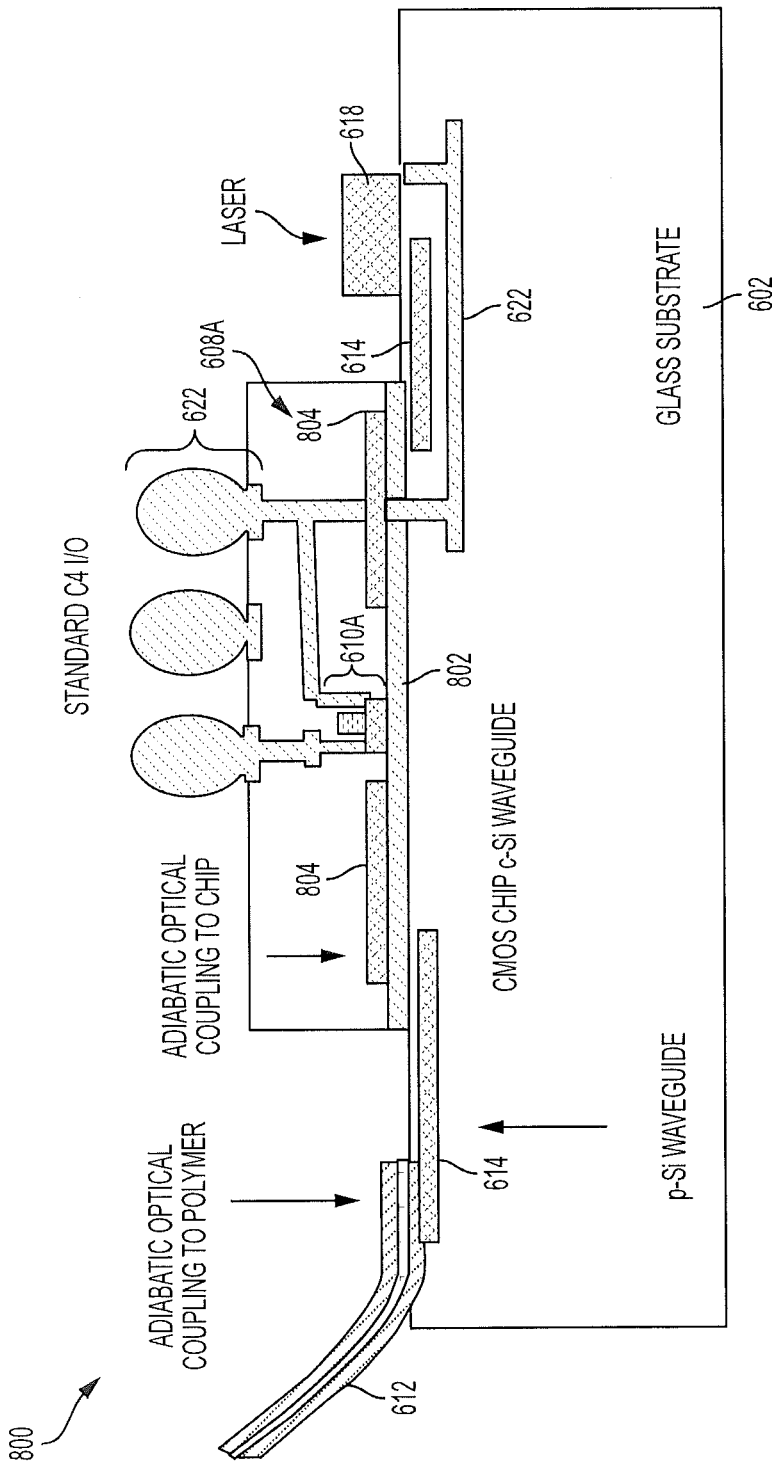
FIG. 8 is a cross-sectional view showing a schematic diagram of another system for providing photonic and electronic connectivity in accordance with one or more embodiments.

Turning now to a more detailed description of one or more embodiments, FIG. 2 is a cross-sectional view showing a simplified schematic diagram of a low-loss glass interposer 200 in accordance with one or more embodiments. Glass interposer 200 includes a glass substrate 202 having integrated therewith a plurality of low-loss, large-grain single-mode polycrystalline silicon waveguides 204, other interposer functional layers 206 and high density wiring 208, configured and arranged as shown. Interposer functional layers 206 include various photonic and electronic components, optical fibers (not shown) and higher level signal processing functionality such as wave division multiplexing. Low-loss, large-grain single-mode polycrystalline silicon waveguides 204 are designed to couple optical signals into and out of interposer functional layers 206 and at least one IC (not shown), which may be directly driven by or directly bonded to glass substrate 202. Glass substrate 202 is dimensionally stable during thermal processing (e.g., up to about 600 degrees Celsius). It is noted that glass interposer 200 shown in FIG. 2 is greatly simplified for ease of illustration and description. In practice, a low-loss glass interposer embodying the present disclosure may include multiple configurations of low-loss large-grain polycrystalline optical waveguides, photonic devices, optoelectronic devices, electronic devices and high density wire interconnections. Example embodiments of low-loss optical coupler systems/platforms incorporating the disclosed low-loss glass interposer are shown in FIGS. 6-8 and described in greater detail later in this disclosure.

An example methodology for forming glass interposer 200 and low-loss, large-grain single-mode polycrystalline waveguides 204 will now be described with reference to a diagram 300 of a pre-anneal, cross-sectional scanning electron microscope (SEM) photo shown in FIG. 3A, a diagram 302 of a post-anneal, top-down SEM photo shown in FIG. 3B, glass interposers 200A, 200B shown in FIGS. 4A-4D, a glass interposer 200C and expanded view 402 shown in FIG. 4E, and a methodology 500 shown in FIG. 5. Referring now to FIGS. 3A, 3B and FIG. 5, methodology 500 begins at block 502 by depositing a diffusion barrier 304 (e.g., an optimized oxide) on glass substrate 202. Diffusion barrier 304 prevents impurities that may be in glass substrate 202 from diffusing into a subsequently applied amorphous silicon layer 308. A lithography (not shown) is applied over diffusion barrier 304 to pattern and define the locations and shapes of wells 306, and a nitride etch and subsequent cleaning are applied to form wells 306 in diffusion barrier 304. In the present example, wells 306 are substantially circular and about 100-200 nanometers in diameter/width, and the well pattern (best shown in FIGS. 4A, 4D and 4E) is a grid with each well 306 spaced 4-5 microns from its adjacent well. As described in greater detail below, well shapes other than circles (e.g., square, rectangular, etc.) are contemplated by the present disclosure. Additionally, well patterns other than grids are contemplated by the present disclosure, as long as the well locations and well spacing are chosen to sufficiently match the chosen dimensions and location of a waveguide pattern 402 (shown in FIGS. 4C, 4D and 4E), which is formed subsequently at block 510 of methodology 500.

At block 506, amorphous silicon or small grain polycrystalline silicon having an initial grain size is deposited. The deposition may be by a low pressure chemical vapor deposition (LPCVD) method, or by other deposition methods such as plasma enhanced chemical vapor deposition (PECVD) or solution application of silicon particles. The deposited amorphous silicon fills wells 306 from the bottom up then forms amorphous silicon layer 308 as best shown in the pre-anneal cross-sectional SEM diagram 300 of FIG. 3A. At block 508, an excimer laser anneal operation known in the art is applied to the deposited silicon to convert amorphous silicon to polycrystalline silicon and cause a regrowth (i.e., an increase in grain size) and recrystallization of silicon from inside well 306 into a large-grain area 312 of silicon layer 308 that surrounds wells 306, as best shown in FIGS.

3B, 4A and 4B. The term "diameter" is used herein to describe the characteristic dimension of the large grains regardless of the shape of the grains. The silicon inside well 306 acts as a nucleation seed crystal 314 for the regrowth and recrystallization. The anneal may be a hydrogen-based anneal performed using a short duration (e.g., less than about one microsecond) application of an excimer laser that heats the amorphous silicon to its melting point. Upon cooling, a final grain size results in large-grain area 312 of the post-anneal polycrystalline silicon. The increase from the initial grain sizes to the final grain sizes, or from amorphous to the final grain sizes reduces the total area of the post-anneal polycrystalline silicon's grain boundary. In other embodiments, other anneal methods or tools may be used, for example flash lamp anneal, rapid thermal anneal, or alternate laser based tools. To achieve the disclosed low-loss optical characteristics of less than about one dB/cm, the final grain size should be a grain diameter/width greater than about one micron.

Figure 4A:
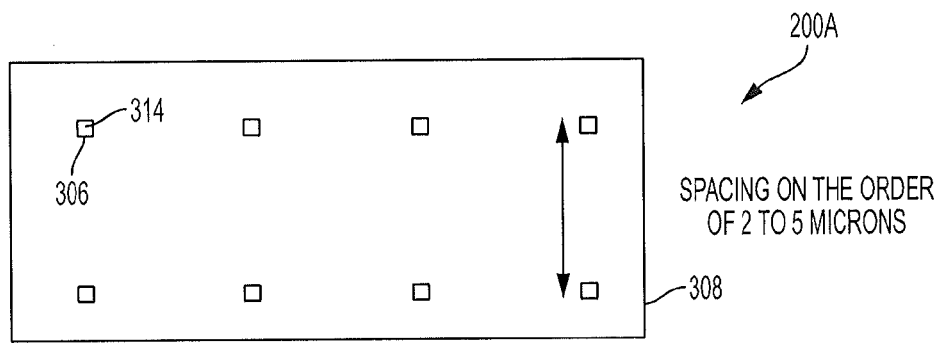
FIG. 4A is a diagram illustrating the formation of an optical waveguide in accordance with one or more embodiments.
Figure 4B:
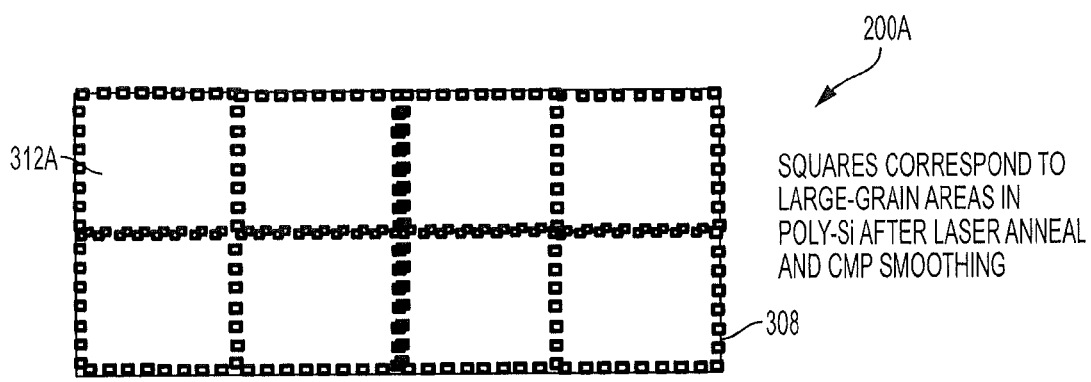
FIG. 4B is another diagram further illustrating the formation of an optical waveguide in accordance with one or more embodiments.

In addition to the substantially circular shapes of wells 306 and large grain areas 312 shown in FIG. 3B, as shown in FIGS. 4A and 4B, the wells and nucleation seed crystals may be substantially square shaped (e.g., wells 306A and nucleation seed crystals 314A) resulting in large-grain areas that are also substantially square shaped (e.g., large-grain area 312A). For the embodiment shown in FIGS. 4A and 4B, the anneal regrowth and recrystallization of block 508 proceeds until the square shaped large-grain areas abut one another. The size and shape of large-grain areas 312, 312A depend on a number of design/fabrication options, including the shape (e.g., circular, square, rectangular, etc.), diameter/width and depth of wells 306, 306A and the duration and laser pulse energy and rate of cooling in the laser anneal performed at block 508. Additionally, the spacing of one large-grain area from another depends on the size/shape of large-grain area 312, 312A and the spacing of each well 306, 306A from its neighboring well(s). All of the above design/fabrication options are selected so that large-grain areas 312, 312A substantially match the desired dimensions and location of a waveguide pattern 402 (shown in FIGS. 4C, 4D and 4E), which is formed subsequently at block 510 of methodology 500. Waveguide pattern 402 defines the dimensions and location of a waveguide that will be formed by the etch operation of block 510, as described in greater detail below.

Alternative shapes, relative sizes and relative spacing of the large-grain areas that can result from different configurations of the above-described design options are shown at 312B, 312C, 312D, 312E in FIG. 4D. As shown in FIG. 4D, the well shapes are circular, and the resulting adjacent large-grain areas may be separated (e.g., large-grain areas 312B and 312C), overlapping (e.g., large-grain areas 312C and 312D; wherein the overlapping area is bound by the dotted lines shown in FIG. 4D), tangential (e.g., large-grain areas 312D and 312E) or selected combinations of thereof. Depending on whether the adjacent large-grain areas are separated, overlapping, tangential or a combination thereof, waveguide pattern 402 may have continuous areas of large-grain material, or may have periodic areas of non-large-grain material corresponding to areas where waveguide pattern 402 is not located over a large-grain area 312B, 312C, 312D, 312E. It is noted that, when implementing embodiments of the present disclosure having periodic areas of non-large-grain material, the resulting impact on the optical loss of the resulting waveguide should be taken into account when making the above-described design choices.

After the anneal operation, block 508 applies a chemical mechanical planarization (CMP) process to silicon layer 308 to remove any topology and smooth the top surface of silicon layer 308. More specifically, the CMP operation reduces the roughness at the boundaries between two grain that can result from the laser-based anneal and crystallization performed at block 508 of methodology 500. As an example, it has been determined through experimental implementation of methodology 500 that after the laser-based anneal and crystallization of block 508, atomic force microscopy (AFM) measured a root means square (RMS) roughness of 27 nanometers (nm) averaged over an area 100 micron$^2$. After application of a CMP for 50 seconds, the RMS roughness was measured at 0.9 nm. In another experimental implementation of methodology 500, after the laser-based anneal operation of block 508, AFM measured an RMS roughness of 10 nm averaged over an area 100 micron$^2$. After application of a CMP for 100 seconds, the RMS roughness was measured at 0.9 nm.

Defects density in the large grain semiconductor material may be further reduced by optionally using a hydrogen based anneal step after the CMP step in block 508, or later in methodology 500. In the hydrogen based anneal, the hydrogen reacts with dangling bond defects to thereby reduce the defect density in the large grain semiconductor material. If a hydrogen plasma tool is used as part of the hydrogen based anneal, the temperature of the anneal may be from about 300 to about 500 degrees Celsius. If a thermal hydrogen tool is used as part of the hydrogen based anneal, the temperature of the anneal may be from about 500 to about 1000 degrees Celsius.

As previously described herein in connection with FIG. 1, the boundaries between one grain and its neighbors (i.e., the grain boundaries) are defects in the crystal structure, and these defects have a certain amount of energy (e.g., grain boundary band 104 shown in FIG. 1). The present disclosure makes and leverages the observation that the amount of optical loss caused by grain boundary band 104 (shown in FIG. 1) of large-grain areas 312, 312A (shown in FIGS. 3B and 4B) will be proportional to the density of the defect states that make up the grain boundary band of large-grain areas 312, 312A. Further, the density of the defect states that make up grain boundary band 104 is determined by the total number of grain boundaries averaged over the relevant large-grain areas 312, 312A of the crystal. According to methodology 500, the optical absorption (i.e., the optical loss) of any light that is transported through large-grain areas 312, 312A of the post-anneal polycrystalline silicon material 308 is reduced by the large grains (e.g., a grain diameter ≥about 1 micron) that result from the laser anneal operation of block 508. The large grains reduce the total number of grain boundaries averaged over the relevant large-grain area(s) of post-anneal polycrystalline silicon material 308, thereby reducing the density of the defect states (e.g., 110, 112 shown in FIG. 1) that make up grain boundary band 104 of large-grain areas 312, 312A, and reducing the optical absorption/loss of any optical signals that are transported through large-grain areas 312, 312A. A hydrogen based anneal step may then be used to further reduce the defect density in the large grain semiconductor material and further reduce optical loss.

Figure 4C:
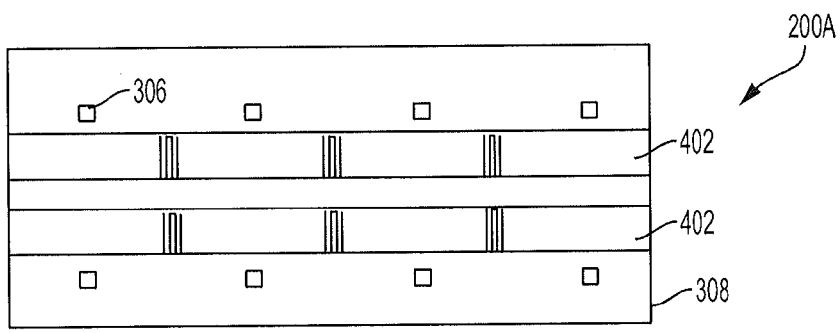
FIG. 4C is another diagram further illustrating the formation of an optical waveguide in accordance with one or more embodiments.
Figure 5:
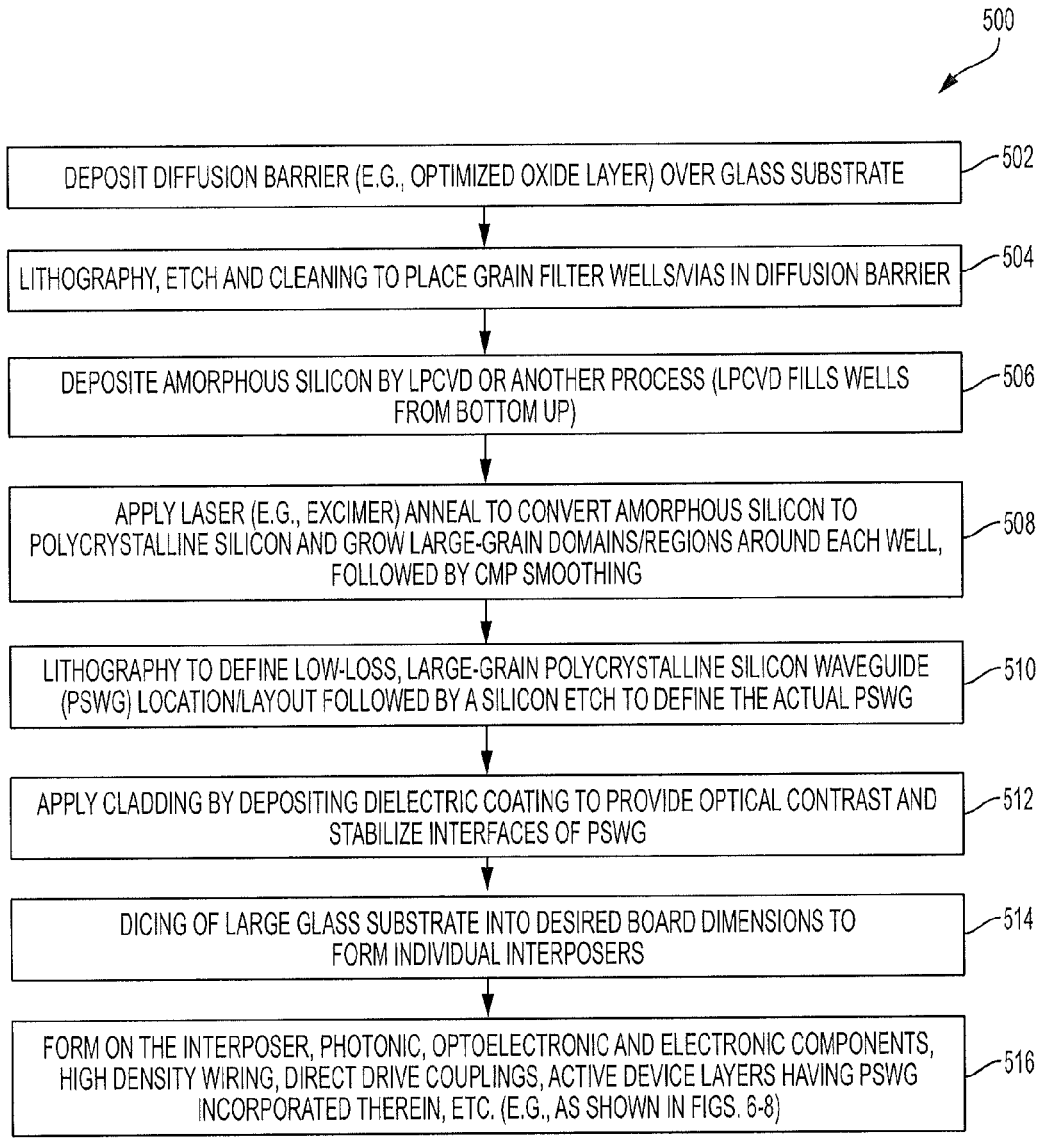
FIG. 5 is a flow diagram illustrating a fabrication methodology in accordance with one or more embodiments.

The operation performed in block 510 of methodology 500 is best illustrated by the top views of glass interposers 200A, 200B, 200C shown in FIGS. 4C, 4D and 4E. For ease of illustration, FIG. 4E also shows an expanded view 404 of one section of glass interposer 200C. In block 510, a lithography in the form of waveguide pattern 402 is applied over the large-grain areas (e.g., 312A, 312B, 312C, 312D, 312E). Waveguide pattern 402 defines the shape and location of a waveguide that is formed by etching away the silicon that this not under waveguide pattern 402, thereby defining and forming the final low-loss, large-grain optical waveguide. Accordingly, after block 510 all silicon not covered by waveguide pattern 402 is removed (including wells 306), and only a waveguide formed substantially from patterned portions of the multiple, post-anneal large-grain areas 312, 312A, 312B, 312C, 312D, 312E remains.

In block 512, a dielectric coating, which has a different refractive index from the multiple large-grain areas 312, is deposited to seal the waveguide and provide an optical contrast at various waveguide interfaces. In block 514, glass substrate 202 is diced into the desired board dimensions to form individual interposers. In block 516, additional components are formed on the interposer including photonic, optoelectronic and electronic components, as well as direct drive couplings and active device layers having low-loss, large-grain waveguides incorporated therein.

FIGS. 6-8 illustrate example implementations of the disclosed low-loss, large-grain single-mode polycrystalline waveguides in various coupler system platforms. FIG. 6 is a cross-sectional view showing a simplified schematic diagram of an overall packaging configuration for a low-loss coupler system 600 that provides electrical and optical connectivity between a low-loss glass substrate 602 and a microprocessor (or IC) 604 in accordance with one or more embodiments of the present disclosure. FIG. 7 is a top-down view of coupler system 600 shown in FIG. 6. The coupler system shown in FIGS. 6 and 7 is simplified for ease of illustration. In practice, a coupler system embodying the present disclosure may include multiple configurations of low-loss large-grain waveguides, photonic devices, optoelectronic devices, electronic devices and high density interconnections.

Coupler system 600 will now be described with reference to components shown in FIG. 6, in FIG. 7 or in both FIG. 6 and FIG. 7. Coupler system 600 includes an adiabatic coupler 612, glass substrate 602 and microprocessor 604, configured and arranged as shown. Microprocessor 604 includes a silicon wafer area 606 and an active device layer 608 having a configuration of active devices, which are represented schematically in FIG. 6 by a single transistor 610. Integrated with glass substrate/interposer 602 are a first low-loss large-grain single-mode polycrystalline silicon optical waveguide 614, a second low-loss large-grain single-mode polycrystalline silicon optical waveguide 714, a wavelength division multiplexer/de-multiplexer 716, a laser 618, a photodiode 720, various high density electrical interconnections 622, a first passive RF network 724, a second passive RF network 726 and a bias control circuit 728, configured and arranged as shown. A coupler system in accordance with the present disclosure may include fewer or more components than shown in FIGS. 6 and 7 according to the particular needs of the design.

In operation, adiabatic coupler 612 couples optical signals (e.g., infrared light) from another microprocessor/component (not shown) through second optical waveguide 714, waveguide division multiplexer/de-multiplexer 716, photodiode 720, and second passive RF network 726 to microprocessor 604. Electronic signals are coupled from microprocessor 604, through first passive RF network 724, laser 618, first optical waveguide 614 and adiabatic coupler 612 to another microprocessor/component (not shown). Active layer 608 of microprocessor 604 is directly coupled to glass substrate 602 through various high density electrical interconnections 622 to form the previously described "direct drive" connections.

The electronic components on microprocessor 604 are optimized for density and to operate at low voltage. For microprocessor tasks that call for transistors and related circuitry that operates at much higher voltages, these higher voltage components/circuitry must ordinarily be located off-chip and routed to and from the microprocessor. The low-loss, large-grain waveguides 614, 714 of the present disclosure, which may be formed according to methodology 500 (shown in FIG. 5), enable packaging efficiencies that allow such higher voltage components to be integrated on glass substrate 602 using, for example, thin-film-transistor (TFT) fabrication technologies, as well as the same silicon that is used to build waveguides 614, 614. First and second passive RF network circuits 724, 726 and bias control circuit 728 are examples of such higher voltage components/circuitry. Bias control circuit 728 enables high-voltage compatible biasing of optoelectronic components. First and second passive RF network circuits 724, 726, which may include thin film transistors, capacitors, inductors and resistors, enable tuning of the RF environment to optimize the direct drive of microprocessor 604.

FIG. 8 is a cross-sectional view showing a schematic diagram of an overall packaging configuration for a coupler system 800 that provides electrical and optical connectivity between a glass substrate 602 and an active layer 608A in accordance with one or more embodiments of the present disclosure. In coupler system 800, low-loss large-grain polycrystalline silicon waveguides 614 are provided on glass substrate 602 and monocrystalline silicon waveguides 804 are provided within active device layer 608A. The monocrystalline silicon waveguides 804 in active device layer 608A are fabricated in the same layer and utilizing the same processes as the traditional electronic components of active device layer 608A by utilizing a zero-change integration methodology. The silicon handle wafer area that is utilized for fabrication of active device layer 608A has been removed prior to bonding by any known process that selectively etches silicon but not silicon dioxide such as TMAH or $XeF_2$. Additionally, the low-loss monocrystalline silicon waveguides 804 within active device layer 608A enable the further incorporation within active device layer 608A of high density wiring 622 and other optoelectronic devices (not shown) such as wave division multiplexers, optical modulators, optical detectors, reflectors, high quality factor filters, and the like. Active device layer 608A is bonded directly to glass substrate 602 through an oxide-oxide bond 802, which is in contrast to the direct drive connection through high density wiring 622 used in coupler system 600 shown in FIG. 6.

Thus it can be seen from the foregoing detailed description and accompanying illustrations, the present disclosure achieves low-loss optical characteristics that enable the effective and efficient implementation of low-loss, large-grain single-mode optical waveguides in an optical coupler system. More specifically, one or more embodiments of the present disclosure form low-loss, large-grain polycrystalline semiconductor waveguides according to a fabrication process that includes forming an oxide layer on a glass substrate, forming a plurality of vias or wells in selected locations of the oxide layer, filling the plurality of wells with amorphous semiconductor material to form a plurality of seed areas within the wells and a layer of amorphous semiconductor material above the wells, laser annealing the amorphous semiconductor material such that the seed areas within the wells form a plurality of large-grain crystallized areas in the semiconductor material surrounding the wells, then forming the optical waveguides from the plurality of large-grain crystallized areas that surround the plurality of wells. CMP smoothing and/or hydrogen based anneal steps may be used to reduce the defect density in these silicon waveguides.

The low-loss optical characteristics achieved according to the present disclosure enable the effective and efficient interconnection of ICs and IC components using an interposer having the disclosed low-loss large-grain single-mode polycrystalline silicon waveguide, photonic devices, optoelectronic devices and electronic devices integrated on, directly coupled to or directly bonded to a mechanically stable substrate (e.g., glass) suitable for high volume manufacturing. The low-loss, large-grain single-mode polycrystalline silicon waveguides couple at least one photonic device with at least one bonded IC and at least one optical fiber.

Technical effects and benefits of the present disclosure include but are not limited to the following. The glass substrate of the interposer is dimensionally stable during thermal processing, which may range up to about 600 degrees Celsius. The disclosed fabrication methodologies enable a highly integrated design that avoids the increased fabrication costs and complexity that results from using separate methods of assembly for the different components of the optical coupler system/platform. The refractive index of the disclosed low-loss large-grain polycrystalline silicon waveguide is high in comparison to the glass substrate of the interposer, which results in a high index contrast and enables the integration of a wide variety of small photonic components. The glass substrate provides a low RF loss environment, which improves the electrical performance of the low-loss large-grain optical waveguide interfaces. High density wiring may be utilized with the low RF loss environment and highly integrated fabrication to allow small components such as inductors and/or capacitors to be implemented as "direct drive" optical components, wherein the active device (e.g., detectors, laser, modulators, etc.) is integrated on the glass substrate/interposer and connected through the high density metal wiring on the glass substrate to any connected ICs that provide the data I/O. The disclosed glass substrate has a coefficient of thermal expansion (CTE) that can be matched to silicon to form the silicon-on-glass platform. In one or more embodiments, the glass substrate can, in addition to integrating the low-loss optical waveguides and electrical interconnections, also integrate thin film silicon driver circuits (e.g., transistors) that can be optimized for different voltages such as the higher voltages than are typically found in integrated CMOS (complementary metal-oxide semiconductor) technology.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The flowchart and block diagrams in the figures illustrate the functionality and operation of possible implementations of systems and methods according to various embodiments of the present disclosure. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. The actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A method of forming a coupler system, the method comprising:
   forming a glass substrate;
   forming a dielectric layer over the glass substrate;
   forming a plurality of wells in the dielectric layer;
   depositing a semiconductor material over the dielectric layer such that the semiconductor material fills the plurality of wells and forms a layer of semiconductor material;
   annealing the semiconductor material such that the semiconductor material inside the plurality of wells act as a nucleation seed producing a post-anneal grain size within a plurality of post-anneal regions in the semiconductor material around the plurality of wells, wherein the post-anneal grain size is greater than about 0.5 micron;

forming at least one waveguide from the post-anneal regions; and forming at least one optoelectronic component over the dielectric layer;

wherein the at least one waveguide is configured to couple the optical signals to or from the at least one optoelectronic component.

2. The method of claim 1, wherein:

the annealing comprises excimer laser annealing; and the method further comprises applying, subsequent to the excimer laser anneal, a chemical mechanical polish to the semiconductor material.

3. The method of claim 1, wherein the plurality of post-anneal regions have optical loss less than about one decibel per centimeter of optical propagation.

4. The method of claim 1, wherein the plurality of post-anneal regions comprise single-mode, polycrystalline silicon.

5. The method of claim 1 further comprising applying, subsequent to the chemical mechanical polish step, a hydrogen based anneal to the semiconductor material.

6. The method of claim 1 further comprising:

forming at least one photonic component over the dielectric layer;

wherein the at least one waveguide is further configured to couple the optical signals to or from the at least one photonic component.

7. The method of claim 6, wherein:

the at least one optoelectronic component comprises a photodiode; and the at least one photonic component comprises at least one of:

a wave division multiplexer;

a wave division demultiplexer; and an optical fiber.

* * * * *